(12) United States Patent
Hou et al.

(10) Patent No.: US 10,859,898 B2
(45) Date of Patent: Dec. 8, 2020

(54) PROJECTION APPARATUS AND HEAT DISSIPATION CONTROL METHOD THEREOF

(71) Applicant: Coretronic Corporation, Hsin-Chu (TW)

(72) Inventors: Kai-Lun Hou, Hsin-Chu (TW); Wen-Hao Chu, Hsin-Chu (TW); Te-Tang Chen, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 16/857,149

(22) Filed: Apr. 23, 2020

(65) Prior Publication Data

US 2020/0341358 A1 Oct. 29, 2020

(30) Foreign Application Priority Data

Apr. 29, 2019 (CN) .......................... 2019 1 0353175

(51) Int. Cl.
- *G03B 21/16* (2006.01)
- *H04N 9/31* (2006.01)
- *H05K 7/20* (2006.01)

(52) U.S. Cl.
CPC ............... *G03B 21/16* (2013.01); *H05K 7/20* (2013.01); *H04N 9/3144* (2013.01)

(58) Field of Classification Search
CPC ............................... G03B 21/16; H04N 9/3144
See application file for complete search history.

(56) References Cited

U.S. PATENT DOCUMENTS

2013/0334966 A1* 12/2013 Kumano ................. F21V 29/52
    315/117
2014/0313490 A1* 10/2014 Miyamoyo ............ G03B 21/16
    353/52

FOREIGN PATENT DOCUMENTS

CN          108776499          11/2018

* cited by examiner

*Primary Examiner* — Ryan D Howard
(74) *Attorney, Agent, or Firm* — JCIPRNET

(57) ABSTRACT

A projection apparatus and a heat dissipation control method thereof are provided. The projection apparatus includes a light valve module, a light source, a brightness sensor, a cooling element, a first temperature sensor, a second temperature sensor and a controller. The controller determines a specified temperature of the cooling element according to the brightness of an illumination beam provided by the light source, and calculates a dew point temperature according to the ambient temperature. The controller adjusts the operating power of the cooling element according to the dew point temperature, the specified temperature and the cold end temperature of the cold end surface of the cooling element. The operating power of the cooling element is flexibly adjusted based on the brightness provided by the light source to avoid a dew formation phenomenon on the cooling element and the light valve module.

16 Claims, 3 Drawing Sheets

PROJECTION APPARATUS AND HEAT DISSIPATION CONTROL METHOD THEREOF

CROSS-REFERENCE TO RELATED APPLICATION

This application claims the priority benefit of China application serial no. 201910353175.3, filed on Apr. 29, 2019. The entirety of the above-mentioned patent application is hereby incorporated by reference herein and made a part of this specification.

BACKGROUND

1. Technical Field

The present disclosure relates to a projection apparatus, and more particularly to a projection apparatus having high heat dissipation efficiency and a heat dissipation control method of the projection apparatus.

2. Description of Related Art

With the development of projection technology, projectors have been widely used in households, offices, schools and other places. As the brightness of the projector becomes higher and higher, the heat received by a light valve element in the projector increases. In addition, the design of today's projectors is also moving toward the direction of thinness and light weight. Traditional passive heat dissipation elements (such as heat sinks) can be used to dissipate heat with cooling fan, but the current heat dissipation demand of the projector becomes gradually difficult to meet.

In order to improve the heat dissipation efficiency, a thermoelectric cooler (TEC) has been applied to a heat dissipation system of the projector. The thermoelectric cooler is an active heat dissipation element based on a semiconductor material. By applying a DC voltage to the thermoelectric cooler, heat is transferred from one end of the thermoelectric cooler to the other end, so that the temperature of one end of the thermoelectric cooler can be reduced, thereby forming a hot end and a cold end. Therefore, when the cold end of the thermoelectric cooler directly or indirectly contacts a light valve element, the thermoelectric cooler can take away the heat received by the light valve element for heat dissipation purposes. At the same time, the cold end of the thermoelectric cooler can be cooled to below ambient temperature, so that the cold end can function when a negative thermal resistance is needed.

However, when the thermoelectric cooler is used to dissipate heat from the light valve element, the heat received by the light valve element may gradually become lower due to the change in brightness, and at this moment, the thermoelectric cooler may cause the temperature of the cold end to be lower than a dew point temperature due to excessive cooling. In this way, once water vapor surrounds the thermoelectric cooler and the light valve element, a dew formation phenomenon occurs on the cold end of the thermoelectric cooler and the light valve element. The dew formation phenomenon not only reduces the heat dissipation capability of the thermoelectric cooler, but also may cause damage to electronic elements. Although sealant, waterproof paint and a special waterproof structure can block water vapor, the cooling capacity of the thermoelectric cooler can be decreased, and at the same time difficulty in processing and additional cost may be caused.

The information disclosed in the Description of Related Art section is only for enhancement of understanding of the background of the described technology and therefore it may contain information that does not form the prior art that is already known to a person of ordinary skill in the art. Further, the information disclosed in the Description of Related Art section does not mean that one or more problems to be resolved by one or more embodiments of the invention were acknowledged by a person of ordinary skill in the art.

SUMMARY

In view of this, the present invention provides a projection apparatus and a heat dissipation control method thereof, which can flexibly adjust the operating power of a cooling element based on the brightness provided by a light source to avoid a dew formation phenomenon on the cooling element and a light valve module.

The present invention provides a projection apparatus, including a light valve module, a light source, a brightness sensor, a cooling element, a first temperature sensor, a second temperature sensor and a controller. The light source provides an illumination beam to the light valve module, and the brightness sensor is disposed beside a transmission path of the illumination beam to sense brightness of the illumination beam. The cooling element has a cold end surface and a hot end surface, and the cold end surface contacts the light valve module to dissipate heat from the light valve module. The first temperature sensor senses an ambient temperature, and the second temperature sensor senses a cold end temperature of the cold end surface. The controller is coupled to the brightness sensor, the first temperature sensor, the second temperature sensor, the cooling element and the light source. The controller determines a specified temperature of the cooling element according to the brightness, and calculates a dew point temperature according to the ambient temperature. Moreover, the controller adjusts the operating power of the cooling element according to the dew point temperature, the specified temperature and the cold end temperature.

The present invention further provides a heat dissipation control method of a projection apparatus, used for the projection apparatus including a light source, a light valve module and a cooling element. A cold end surface of the cooling element contacts the light valve module to dissipate heat from the light valve module. The heat dissipation control method includes: obtaining the brightness of an illumination beam provided by the light source through a brightness sensor; determining a specified temperature of the cooling element according to the brightness; obtaining an ambient temperature by the first temperature sensor, and calculating a dew point temperature according to the ambient temperature; obtaining a cold end temperature of the cold end surface by a second temperature sensor; and adjusting the operating power of the cooling element according to the dew point temperature, the specified temperature and the cold end temperature.

Based on the above, the projection apparatus and the heat dissipation control method thereof provided by the present invention can determine the specified temperature according to the brightness of the light source, and control the temperature of the cold end surface of the cooling element for dissipating heat from the light valve module to maintain between the specified temperature and the dew point temperature. Therefore, even if the brightness provided by the light source is changed, the dew formation phenomenon can be prevented from occurring on the cooling element and the light valve module.

In order to make the aforementioned and other objectives and advantages of the present invention comprehensible, embodiments accompanied with figures are described in detail below.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Embodiments of the present invention will be illustrated below with the accompanying drawings. The directional terms mentioned in the present invention, like "above", "below", "front", "back", "left", and "right", refer to the directions in the appended drawings. Therefore, the directional terms are only used for illustration instead of limiting the present invention.

Figure 1:
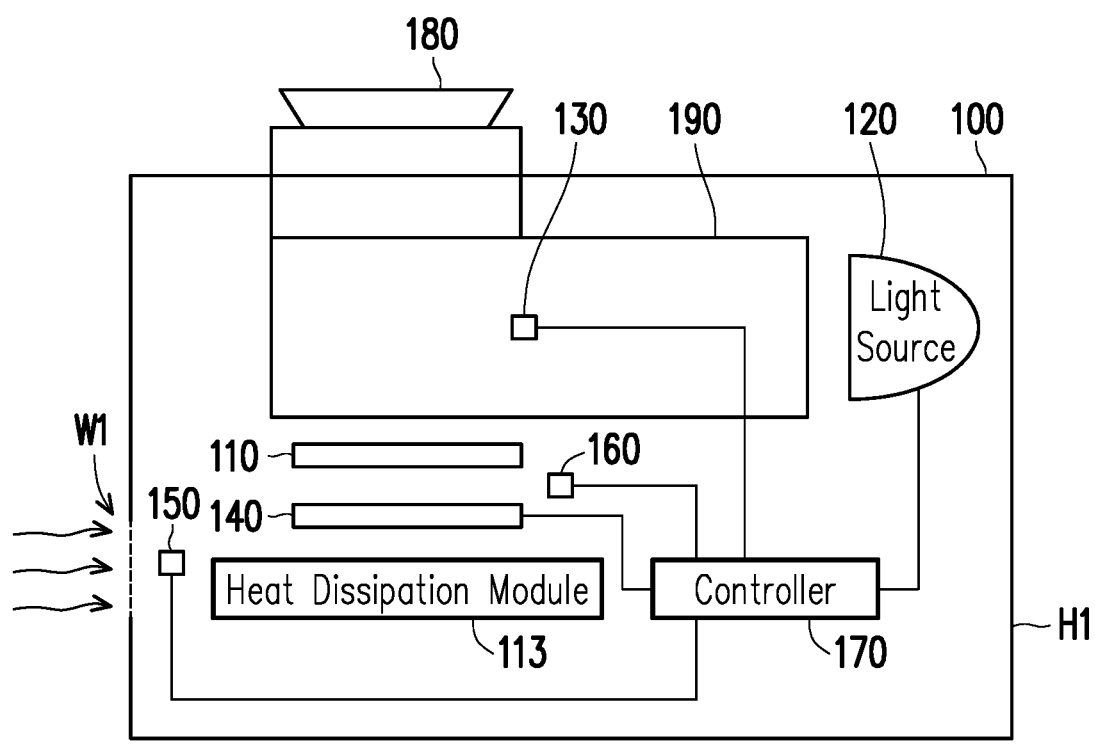
FIG. 1 is a schematic diagram of a projection apparatus according to an embodiment of the present invention.

FIG. 1 is a schematic diagram of a projection apparatus according to an embodiment of the present invention. According to FIG. 1, a projection apparatus 100 of the present embodiment includes a light valve module 110, a light source 120, a brightness sensor 130, a cooling element 140, a first temperature sensor 150, a second temperature sensor 160, a controller 170, a projection lens module 180, an optical engine module 190 and a heat dissipation module 113.

The light source 120 is configured to generate an illumination beam and provide the illumination beam for the light valve module 110 via the optical engine module 190. The light source 120 is, for example, a metal halide lamp, a high pressure mercury lamp, or a solid-state illumination source such as a light emitting diode, a laser diode, or the like.

The optical engine module 190 includes a plurality of optical elements, such as optical lenses, reflectors, etc., and the optical engine module 190 directs the illumination beam generated by the light source 120 to the light valve module 110. The light valve module 110 is, for example, a digital micromirror device (DMD) or a liquid crystal on silicon (LCOS), and is used to convert the illumination beam into an image beam and project the illumination beam outward through the projection lens module 180, thereby enabling the projection apparatus 100 to achieve a projection action. The brightness sensor 130 is disposed beside a transmission path of the illumination beam to sense brightness of the illumination beam generated by the light source 120.

The cooling element 140 is an active heat dissipation element, such as a thermoelectric cooler (TEC). The material of the thermoelectric cooler is, for example, an N-type semiconductor, a compound of a P-type semiconductor, or other thermoelectric material. The cooling element 140 has a cold end surface and a hot end surface. When the cooling element 140 is energized, the temperature of the cold end surface is lower than the temperature of the hot end surface. The cold end surface of the cooling element 140 may directly or indirectly contact the light valve module 110 (heat source) to dissipate heat from the light valve module 110.

Figure 2:
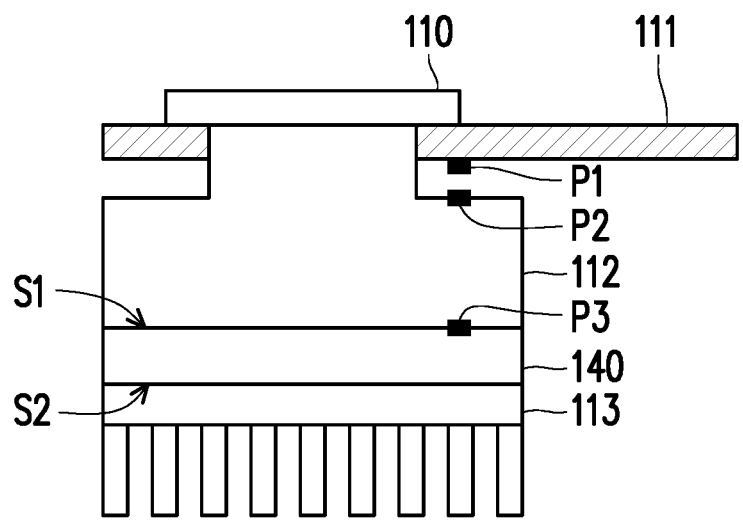
FIG. 2 is a schematic diagram showing the relationship between a cooling element and a heat dissipation module according to an embodiment of the present invention.

In an embodiment, the cooling element 140 may be used to dissipate heat from the light valve module 110 together with the heat dissipation module 113. FIG. 2 is a schematic diagram showing the relationship between the cooling element and the heat dissipation module according to an embodiment of the present invention. According to FIG. 2, the light valve module 110 is disposed on a carrier substrate 111. One end of a metal heat conducting block 112 contacts the light valve module 110 via a perforation of the carrier substrate 111, and the other end of the metal heat conducting block 112 contacts the cold end surface S1 of the cooling element 140. The material of the metal heat conducting block 112 may be, for example, copper, aluminum or other metal that can achieve a heat conduction effect. The hot end surface S2 of the cooling element 140 contacts the heat dissipation module 113. The heat dissipation module 113 is, for example, a heat fin set. Therefore, the cooling element 140 can conduct heat of the light valve module 110 to the heat dissipation module 113, thereby achieving higher heat dissipation efficiency. The carrier substrate 111 is, for example, a circuit board for providing control signals for the light valve module 110.

The first temperature sensor 150 is used to sense an ambient temperature. In an embodiment, the projection apparatus 100 includes a casing H1, and the first temperature sensor 150 is disposed adjacent to an air inlet W1 of the casing H1. However, in other embodiments, the first temperature sensor 150 can be disposed at any place where the ambient temperature can be detected, for example, on the surface of the casing H1, which is not limited by the present invention. The second temperature sensor 160 senses the cold end temperature of the cold end surface S1 of the cooling element 140. The second temperature sensor 160 may be disposed at any position where the cold end temperature of the cold end surface can be sensed. For example, in the embodiment of FIG. 2, the second temperature sensor 160 may be disposed at a position, adjacent to the metal heat conducting block 112 (e.g., position P1), of the carrier substrate 111. Alternatively, the second temperature sensor 160 may be disposed on the metal heat conducting block 112 (e.g., position P2). Still alternatively, the second temperature sensor 160 may be disposed on the cold end surface S1 (e.g., position P3).

The controller 170 is coupled (electrically connected) to the brightness sensor 130, the first temperature sensor 150, the second temperature sensor 160, the cooling element 140 and the light source 120. The controller 170 may be a control circuit of any type, and the controller 130 is, for example, a chipset, a microprocessor, a microcontroller, a programmable logic device (PLD) or other devices, which is not limited by the present invention. In the present embodiment, the controller 170 determines a specified temperature of the cooling element 140 according to the brightness sensed by the brightness sensor 130 in the optical engine module 190. The controller 170 calculates a dew point temperature based on the ambient temperature sensed by the first temperature sensor 150. Next, the controller 170 adjusts the operating power of the cooling element 140 according to the dew point temperature, the specified temperature and the cold end temperature. Furthermore, the controller 170 compares the cold end temperature of the cold end surface S1 with the dew point temperature and the specified temperature to adjust the operating power of the cooling element 140 according to the temperature comparison result. The specified temperature as the upper temperature limit value is determined based on the sensed brightness. Therefore, the present invention can control the cooling capacity of the cooling element 140 based on the brightness of the light source 120 and the ambient temperature to avoid the dew formation phenomenon on the cooling element 140 and the light valve module.

Figure 3:
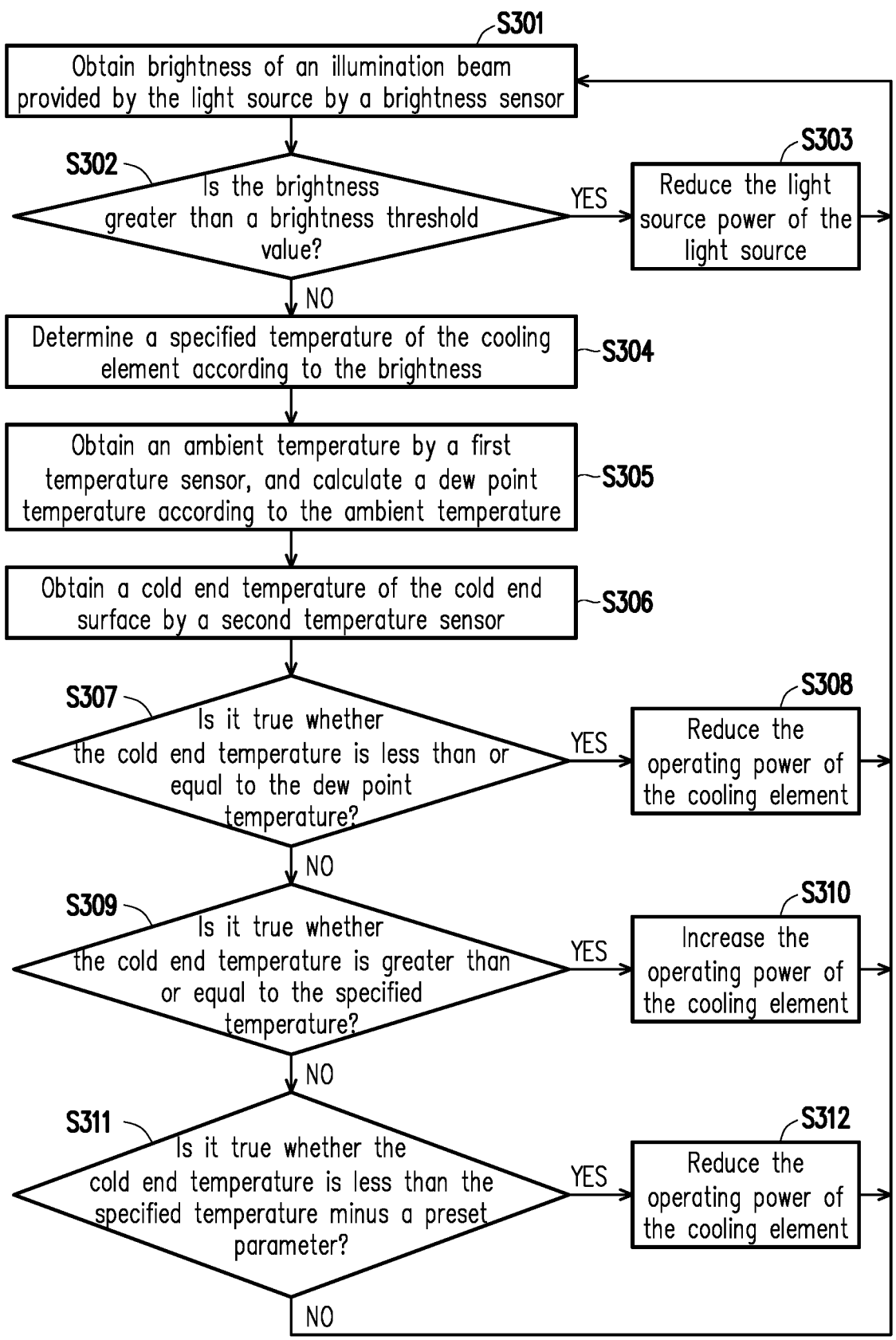
FIG. 3 is a flow chart of a heat dissipation control method according to an embodiment of the present invention.

To further illustrate how the controller 170 adjusts the operating power of the cooling element 140 based on the temperature comparison result, the present invention will be described below in detail with reference to an embodiment. FIG. 3 is a flow chart of a heat dissipation control method according to an embodiment of the present invention, and the method flow of FIG. 3 may be implemented by the elements of the projection apparatus 100 of FIG. 1. According to FIG. 1 and FIG. 3 simultaneously, the detailed steps of the heat dissipation control method of the present embodiment will be described below with the elements of the projection apparatus 100 of FIG. 1.

In step S301, the controller 170 obtains the brightness of the illumination beam provided by the light source 120 through the brightness sensor 130. In step S302, the controller 170 determines whether the brightness is greater than a brightness threshold value. When the brightness is greater than the brightness threshold value (YES in step S302), in step S303, the controller 170 reduces the light source power of the light source 120. Specifically, when the brightness of the light source 120 is too high, the heat generated by the light source 120 exceeds the heat that a cooling element 140 can take away at the maximum operating power. Then, when the controller 170 determines that the brightness is greater than the brightness threshold value, the controller 170 will reduce the light source power of the light source 120 to prevent the temperature of the light valve module 140 from being too high. Therefore, the service life of the light valve module 140 can be extended. The brightness threshold value can be set based on the cooling capacity of the cooling element 140 and the heat dissipation capability of the heat dissipation module 113. However, the brightness threshold value can be set according to the actual application, which is not limited by the present invention.

When the brightness is not greater than the brightness threshold value (NO in step S302), in step S304, the controller 170 determines the specified temperature of the cooling element 140 according to the brightness. Specifically, the specified temperature is used to determine whether the cold end temperature of the cold end surface of the cooling element 140 is too high, so that the controller 170 can instantly adjust the operating power of the cooling element 140 to improve the heat dissipation capability. It is worth noting that the temperature of the light valve module 110 will rise as the brightness increases, so the heat that the cooling element 140 needs to take away also rises as the brightness increases. On the contrary, when the light source 120 provides lower brightness, the heat that the cooling element 140 needs to take away is also relatively reduced. It can be seen that the cooling capacity required by the cooling element 140 to dissipate heat from the light valve module 110 is related to the brightness of the light source 120. Therefore, in the embodiments of the present invention, the controller 170 determines the specified temperature for controlling the operating power of the cooling element 140 according to the brightness of the light source 120, whereby the specified temperature of the cooling element 140 can be varied with the brightness. In this way, it can be avoided that the cold end temperature is lower than the dew point temperature due to too high operating power of the cooling element 140 when the brightness is low, thereby preventing the dew formation phenomenon.

It should be noted that the controller 170 determines the specified temperature according to the rule that the specified temperature decreases as the brightness increases. For example, Table 1 is an example of specified temperature and brightness.

| Brightness (LM) | Specified Temperature (° C.) |
| --- | --- |
| 3000 | 56 |
| 4000 | 55 |
| 5000 | 53 |
| 6000 | 51 |
| 7000 | 49 |
| 8000 | 47 |
| 9000 | 45 |
| 10000 | 43 |
| 11000 | 41 |
| 12000 | 39 |
| 13000 | 37 |

Figure 4:
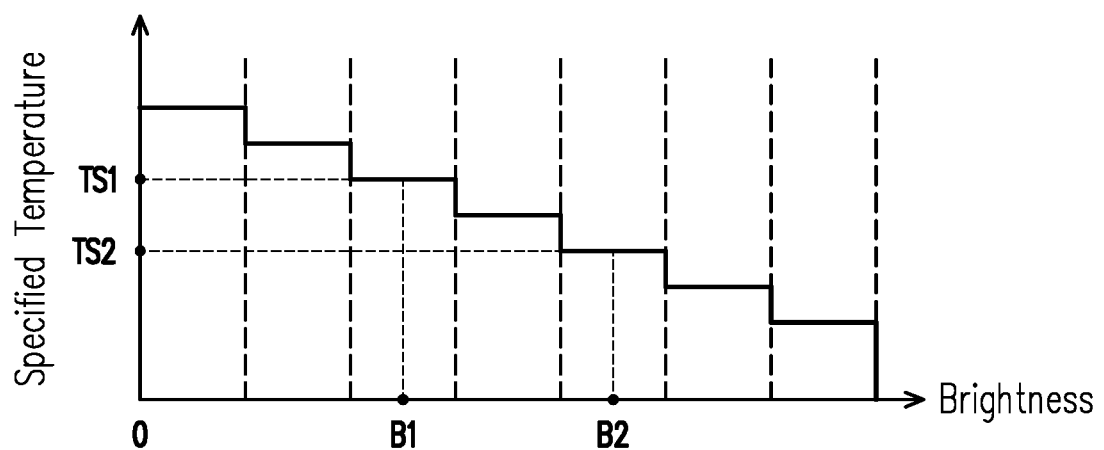
FIG. 4 is a schematic diagram showing the relationship between a specified temperature and brightness according to an embodiment of the present invention.

For another example, FIG. 4 is a schematic diagram showing the relationship between the specified temperature and brightness according to an embodiment of the present invention. According to FIG. 4, different brightness intervals correspond to different specified temperatures. The controller 170 can determine which brightness interval the brightness sensed by the brightness sensor 130 falls into to determine the corresponding specified temperature. In the example of FIG. 4, when the brightness sensed by the brightness sensor 130 is the first brightness value B1, the controller 170 may determine that the specified temperature is the first temperature value Ts1. When the brightness sensed by the brightness sensor 130 is the second brightness value B2 that is greater than the first brightness value B1, the controller 170 may determine that the specified temperature is the second temperature value Ts2 that is less than the first temperature value Ts1. However, Table 1 and FIG. 4 are merely examples for illustration and are not intended to limit the present invention.

Go back to the flow of FIG. 3. In step S305, the controller 170 obtains the ambient temperature by the first temperature sensor 150, and calculates the dew point temperature according to the ambient temperature. The dew point temperature is the temperature at which the vaporous water in the air needs to be reduced to condense into liquid water. For example, in an embodiment, the controller 170 may determine the dew point temperature by subtracting a preset value (e.g., 1° C.) from the ambient temperature. In another embodiment, the controller 170 may also determine the dew point temperature by referring to the ambient humidity and the ambient temperature simultaneously.

In step S306, the controller 170 obtains the cold end temperature of the cold end surface by the second temperature sensor 160. Next, in step S307, the controller 170 determines whether the cold end temperature is less than or equal to the dew point temperature.

When the cold end temperature is less than or equal to the dew point temperature (YES in step S307), in step S308, the controller 170 reduces the operating power of the cooling element 140. Specifically, when the cold end temperature is less than or equal to the dew point temperature, the cold end temperature is too low and a dew formation phenomenon may occur. Therefore, when the cold end temperature is less than or equal to the dew point temperature, the controller 170 will reduce the operating power of the cooling element 140 to reduce the cooling capacity of the cooling element 140 such that the temperature of the cold end surface of the cooling element 140 may rise to prevent the dew formation phenomenon from occurring.

When the cold end temperature is greater than the dew point temperature (NO in step S307), in step S309, the controller 170 determines whether the cold end temperature is greater than or equal to the specified temperature. When the cold end temperature is greater than or equal to the specified temperature (YES in step S309), in step S310, the controller 170 increases the operating power of the cooling element 140. Specifically, when the cold end temperature is greater than or equal to the specified temperature, the cold end temperature is too high to effectively dissipate heat from the light valve element 110. Therefore, when the cold end temperature is greater than or equal to the specified temperature, the controller 170 increases the operating power of the cooling element 140 to enhance the cooling capacity of the cooling element 140 such that the temperature of the cold end surface of the cooling element 140 may decrease to realize the purpose of effective heat dissipation. By the implementation of step S307 and step S309, the controller 170 controls the cold end temperature to maintain between the dew point temperature and the specified temperature by adjusting the operating power supplied to the cooling element 140. Therefore, the controller 170 can control the cold end temperature of the cooling element 140 to maintain between the dew point temperature and the specified temperature, so that the heat can be effectively dissipated from the light valve module 110 and the dew formation phenomenon can be prevented during the operation of the projection apparatus 100.

When the cold end temperature is not greater than or equal to the specified temperature (NO in step S309), in step S311, the controller 170 determines whether the cold end temperature is less than the specified temperature minus the preset parameter. When the cold end temperature is less than the specified temperature minus the preset parameter (YES in step S311), in step S312, the controller 170 reduces the operating power of the cooling element 140. Specifically, when the cold end temperature is less than the specified temperature minus the preset parameter, there is still a gap between the cold end temperature and the specified temperature as the upper limit, and the rise of the cold end temperature is allowable. In an embodiment, the preset parameter is, for example, 1-2° C. Therefore, when the cold end temperature is less than the specified temperature minus the preset parameter, the controller 170 can reduce the operating power of the cooling element 140 to slightly reduce the cooling capacity of the cooling element 140 to achieve the effect of saving energy. It should be noted that step S311 and step S312 are selectively implementable. In other words, in other embodiments, step S311 and step S312 may be omitted.

It should be further noted that, in an embodiment, the controller 170 adjusts the operating power of the cooling element 140 by adjusting the magnitude of the operating current supplied to the cooling element 140, thereby achieving the purpose of adjusting the cooling capacity of the cooling element 140. Specifically, the controller 170 may increase the magnitude of current supplied to the cooling element 140 to increase the operating power of the cooling element 140. The controller 170 may reduce the magnitude of current supplied to the cooling element 140 to reduce the operating power of the cooling element 140. In an embodiment, the operating power of the cooling element 140 may be adjusted between 1% and 10%.

Figure 5:
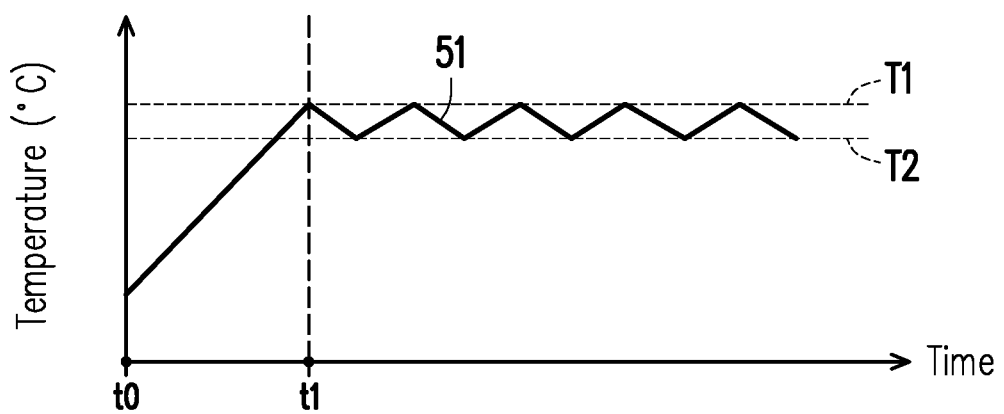
FIG. 5 is a schematic diagram of a cold end temperature according to an embodiment of the present invention.

FIG. 5 is a schematic diagram of the temperature of the light valve element according to an embodiment of the present invention. According to FIG. 5, a curve 51 represents a change in temperature of the light valve module 110. At time t0, the projection apparatus 100 is turned on. At time t0-t1, the cooling element 140 is not activated, and as the operating time of the projection apparatus 100 increases, the temperature of the light valve module 110 gradually rises due to the illumination of the illumination beam. At time t1, when the temperature of the light valve module 110 reaches the specified temperature T1, the cold end temperature of the cold surface of the cooling element 140 that is in contact with the light valve module 110 and that is not activated also reaches the specified temperature T1. When the cooling element 140 is not activated, in response to that the controller 170 determines that the cold end temperature reaches the specified temperature T1, the controller 170 activates the cooling element 140 to dissipate heat from the light valve module 110. Therefore, at time t1, the controller 170 determines that the cold end temperature reaches the specified temperature T1, and the controller 140 activates the cooling element 140 to dissipate heat from the light valve module 110. After the cooling element 140 is activated, the controller 170 can control the cold surface temperature of the cooling element 140 between the dew point temperature T2 and the specified temperature T1 by adjusting the operating power supplied to the cooling element 140, which is equivalent to adjusting the temperature of the light valve module 110 between the dew point temperature T2 and the specified temperature T1.

Based on the above, the projection apparatus and the heat dissipation control method thereof provided by the present invention can be combined with the setting of the temperature sensor to control the operating power of the cooling element according to the temperature comparison result, so as to obtain a good heat dissipation effect capable of rapidly reflecting the temperature status. In addition, the projection apparatus and the heat dissipation control method thereof provided by the present invention can determine the specified temperature for controlling the operating power of the cooling element according to the brightness of the light source. Therefore, when the light source provides a low-brightness illumination beam without requiring a strong cooling capacity to dissipate heat from the light valve module, the operating power of the cooling element can be controlled within a lower operating range, thereby avoiding the dew formation phenomenon and achieving the effect of saving energy.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A projection apparatus, comprising: a light valve module, a light source, a brightness sensor, a cooling element, a first temperature sensor, a second temperature sensor and a controller, wherein
the light source provides an illumination beam to the light valve module,
the brightness sensor is disposed beside a transmission path of the illumination beam to sense brightness of the illumination beam,
the cooling element comprises a cold end surface and a hot end surface, wherein the cold end surface contacts the light valve module to dissipate heat from the light valve module,
the first temperature sensor senses an ambient temperature,
the second temperature sensor senses a cold end temperature of the cold end surface, and
the controller is coupled to the brightness sensor, the first temperature sensor, the second temperature sensor, the cooling element and the light source, the controller determines a specified temperature of the cooling element according to the brightness, and calculates a dew point temperature according to the ambient temperature,
wherein the controller adjusts an operating power of the cooling element according to the dew point temperature, the specified temperature and the cold end temperature.

2. The projection apparatus of claim 1, wherein when the brightness is a first brightness value, the controller determines that the specified temperature is a first temperature value; and when the brightness is a second brightness value that is greater than the first brightness value, the controller determines that the specified temperature is a second temperature value, and the second temperature value is less than the first temperature value.

3. The projection apparatus of claim 1, wherein when the brightness is greater than a brightness threshold value, the controller reduces a light source power of the light source.

4. The projection apparatus of claim 1, wherein when the controller determines that the cold end temperature is less than or equal to the dew point temperature, the controller reduces the operating power of the cooling element.

5. The projection apparatus of claim 1, wherein when the controller determines that the cold end temperature is greater than or equal to the specified temperature, the controller increases the operating power of the cooling element.

6. The projection apparatus of claim 5, wherein when the controller determines that the cold end temperature is less than the specified temperature minus a preset parameter, the controller reduces the operating power of the cooling element.

7. The projection apparatus of claim 1, wherein when the cooling element is not activated, in response to the controller determines that the cold end temperature reaches the specified temperature, the controller activates the cooling element to dissipate the heat from the light valve module.

8. The projection apparatus of claim 1, wherein the projection apparatus further comprises a casing, the casing comprises an air inlet, and the first temperature sensor is disposed adjacent to the air inlet.

9. The projection apparatus of claim 1, wherein the hot end surface of the cooling element contacts a heat dissipation module.

10. A heat dissipation control method, used for a projection apparatus comprising a light source, a light valve module and a cooling element, wherein a cold end surface of the cooling element contacts the light valve module to dissipate heat from the light valve module, wherein the method comprises:
obtaining brightness of an illumination beam provided by the light source through a brightness sensor;
determining a specified temperature of the cooling element according to the brightness;
obtaining an ambient temperature through a first temperature sensor, and calculating a dew point temperature according to the ambient temperature;
obtaining a cold end temperature of the cold end surface by a second temperature sensor; and
adjusting an operating power of the cooling element according to the dew point temperature, the specified temperature and the cold end temperature.

11. The heat dissipation control method of claim 10, wherein the step of determining the specified temperature of the cooling element according to the brightness comprises:

when the brightness is a first brightness value, determining that the specified temperature is a first temperature value; and when the brightness is a second brightness value and the second brightness value is greater than the first brightness value, determining that the specified temperature is a second temperature value that is less than the first temperature value.

12. The heat dissipation control method of claim 10, wherein after the step of obtaining the brightness of the illumination beam provided by the light source through the brightness sensor, the heat dissipation control method further comprises:

determining whether the brightness is greater than a brightness threshold value; and when the brightness is greater than the brightness threshold value, reducing a light source power of the light source.

13. The heat dissipation control method of claim 10, wherein the step of adjusting the operating power of the cooling element according to the dew point temperature, the specified temperature and the cold end temperature comprises:

determining whether the cold end temperature is less than or equal to the dew point temperature; and when the cold end temperature is less than or equal to the dew point temperature, reducing the operating power of the cooling element.

14. The heat dissipation control method of claim 10, wherein the step of adjusting the operating power of the cooling element according to the dew point temperature, the specified temperature and the cold end temperature comprises:

determining whether the cold end temperature is greater than or equal to the specified temperature; and when the cold end temperature is greater than or equal to the specified temperature, increasing the operating power of the cooling element.

15. The heat dissipation control method of claim 14, wherein the step of adjusting the operating power of the cooling element according to the dew point temperature, the specified temperature and the cold end temperature further comprises:

determining whether the cold end temperature is less than the specified temperature minus a preset parameter; and when the cold end temperature is less than the specified temperature minus the preset parameter, reducing the operating power of the cooling element.

16. The heat dissipation control method of claim 10, wherein the method further comprises:

when the cooling element is not activated, in response to the cold end temperature reaching the specified temperature, activating the cooling element to dissipate heat from the light valve module.

\* \* \* \* \*